(12) United States Patent
Liu

(10) Patent No.: US 12,237,384 B2
(45) Date of Patent: Feb. 25, 2025

(54) SEMICONDUCTOR DEVICE AND FORMING METHOD THEREOF

(71) Applicant: CHANGXIN MEMORY TECHNOLOGIES, INC., Hefei (CN)

(72) Inventor: ChihCheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 562 days.

(21) Appl. No.: 17/515,806

(22) Filed: Nov. 1, 2021

(65) Prior Publication Data

US 2022/0115509 A1   Apr. 14, 2022

Related U.S. Application Data

(63) Continuation of application No. PCT/CN2021/106919, filed on Jul. 16, 2021.

(30) Foreign Application Priority Data

Oct. 14, 2020   (CN) .................. 202011094813.3

(51) Int. Cl.
*H01L 29/417* (2006.01)
*H01L 29/40* (2006.01)
*H01L 29/45* (2006.01)

(52) U.S. Cl.
CPC ...... *H01L 29/41775* (2013.01); *H01L 29/401* (2013.01); *H01L 29/456* (2013.01)

(58) Field of Classification Search
CPC ......... H01L 29/41775; H01L 21/76816; H01L 23/485; H01L 21/76897; H01L 21/28518
See application file for complete search history.

(56) References Cited

U.S. PATENT DOCUMENTS 5,661,085 A * 8/1997 Teong ................ H01L 29/456
                                                438/653
6,037,211 A * 3/2000 Jeng .................. H10B 12/01
                                                257/E21.507
7,560,337 B2   7/2009 Ho
(Continued)

FOREIGN PATENT DOCUMENTS

CN   101000891 A   7/2007
CN   105097650 A   11/2015
CN   110767654 A   2/2020

*Primary Examiner* — Walter H Swanson
*Assistant Examiner* — Moataz Khalifa
(74) *Attorney, Agent, or Firm* — Kilpatrick Townsend & Stockton LLP

(57) ABSTRACT

A semiconductor device and a forming method thereof are provided. The semiconductor device includes a substrate, a gate structure and a self-aligned contact structure. The substrate includes a source region and a drain region; the gate structure is formed on the substrate and are located between the source region and the drain region; and the self-aligned contact structure is formed on the substrate and includes a first contact structure, a second contact structure and a third contact structure sequentially connected in a direction perpendicular to the substrate, the first contact structure is in contact with the source region or the drain region, and a cross-sectional area of the second contact structure in a direction parallel to the substrate is greater than that of the first contact structure and that of the third contact structure in the direction parallel to the substrate.

15 Claims, 5 Drawing Sheets

(56) References Cited

U.S. PATENT DOCUMENTS

| | | |
|---|---|---|
| 8,158,963 B2 | 4/2012 | Ho |
| 9,000,534 B2 | 4/2015 | Knorr |
| 2007/0173019 A1 | 7/2007 | Ho |
| 2008/0217775 A1 | 9/2008 | Pai |
| 2009/0236743 A1 | 9/2009 | Ho |
| 2020/0035796 A1 | 1/2020 | Lee et al. |
| 2020/0126855 A1* | 4/2020 | Chang ............... H01L 23/53266 |

* cited by examiner

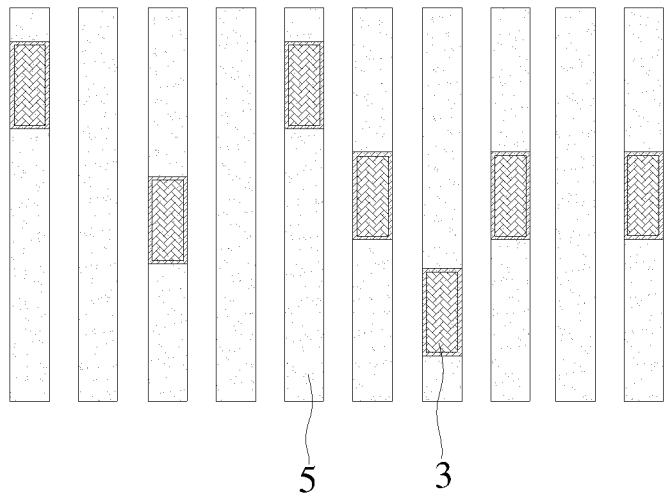

FIG. 3

| A first interlayer insulating layer, a second interlayer insulating layer and a third interlayer insulating layer are sequentially formed on the surface of the substrate, the first interlayer insulating layer is located in the region outside gate structures, and the second interlayer insulating layer covers the gate structures | ⟵ S110 |

| The first interlayer insulating layer, the second interlayer insulating layer, and the third interlayer insulating layer are etched respectively to form contact holes, each contact hole includes a first hole section, a second hole section and a third hole section that are sequentially butted, and the cross-sectional area of the second hole section in the direction parallel to the substrate is greater than that of the first hole section and that of the third hole section in the direction parallel to the substrate | ⟵ S120 |

| A conductive material is deposited in the first hole sections, the second hole sections, and the third hole sections to form self-aligned contact structures | ⟵ S130 |

FIG. 4

SEMICONDUCTOR DEVICE AND FORMING METHOD THEREOF

CROSS-REFERENCE TO RELATED APPLICATIONS

This is a continuation application of International Patent Application No. PCT/CN2021/106919, filed on Jul. 16, 2021, which claims priority to Chinese patent application No. 202011094813.3, filed on Oct. 14, 2020 and entitled "SEMICONDUCTOR DEVICE AND FORMING METHOD THEREOF". The disclosures of International Patent Application No. PCT/CN2021/106919 and Chinese patent application No. 202011094813.3 are hereby incorporated by reference in their entireties.

BACKGROUND

Dynamic Random Access Memory (DRAM) is widely used in mobile devices such as mobile phones and tablet computers due to the advantages such as small size, high degree of integration, and fast transmission speed. With the continuous development of mobile devices, there are great demands on small size and integration of memories.

However, with the size decreasing, the spacing between the gate contact and the source/drain contact in the DRAM also decreases, making it difficult to ensure adequate separation between the gate contact and the source/drain contact to avoid short circuit of the gate contact and the source/drain contact.

It should be noted that the information disclosed in background is used only to enhance the understanding of the background of the disclosure, and therefore may include information that does not constitute the related art known to those of ordinary skill in the art.

SUMMARY

To overcome the foregoing deficiencies in the related art, the disclosure provides a semiconductor device and a forming method thereof.

According to an aspect of the disclosure, a semiconductor device is provided. The semiconductor device includes:
  a substrate, including a source region and a drain region;
  a gate structures, formed on the substrate and located between the source region and the drain region; and
  a self-aligned contact structure, formed on the substrate and including a first contact structure, a second contact structure and a third contact structure sequentially connected in a direction perpendicular to the substrate, the first contact structure being in contact with the source region or the drain region, and a cross-sectional area of the second contact structure in a direction parallel to the substrate being greater than that of the first contact structure and that of the third contact structure in the direction parallel to the substrate.

According to an aspect of the disclosure, a forming method of a semiconductor device is provided. The forming method includes:
  providing a substrate, including a source region and a drain region;
  forming a gate structure on the substrate, the gate structure being located between the source region and the drain region; and
  forming a self-aligned contact structure on the substrate, the self-aligned contact structure including a first contact structure, a second contact structure and a third contact structure sequentially connected in a direction perpendicular to the substrate, the first contact structures being in contact with the source region or the drain region, and a cross-sectional area of the second contact structure in a direction parallel to the substrate being greater than that of the first contact structure and that of the third contact structure in the direction parallel to the substrate.

It should be understood that both the foregoing general description and the following detailed description are exemplary and explanatory only and are not restrictive of the disclosure.

BRIEF DESCRIPTION OF THE DRAWINGS

The accompanying drawings, which are incorporated in and constitute a part of the specification, illustrate embodiments consistent with the disclosure and, together with the specification, serve to explain the principles of the disclosure. It is apparent that the drawings in the following description show only some embodiments of the disclosure, and those of ordinary skill in the art may also obtain other accompanying drawings according to these accompanying drawings without creative efforts.

FIG. 3 illustrates a top view of a semiconductor device according to an embodiment of the disclosure.

FIG. 4 illustrates a flowchart of forming a self-aligned contact structure according to an embodiment of the disclosure.

Figure 1:
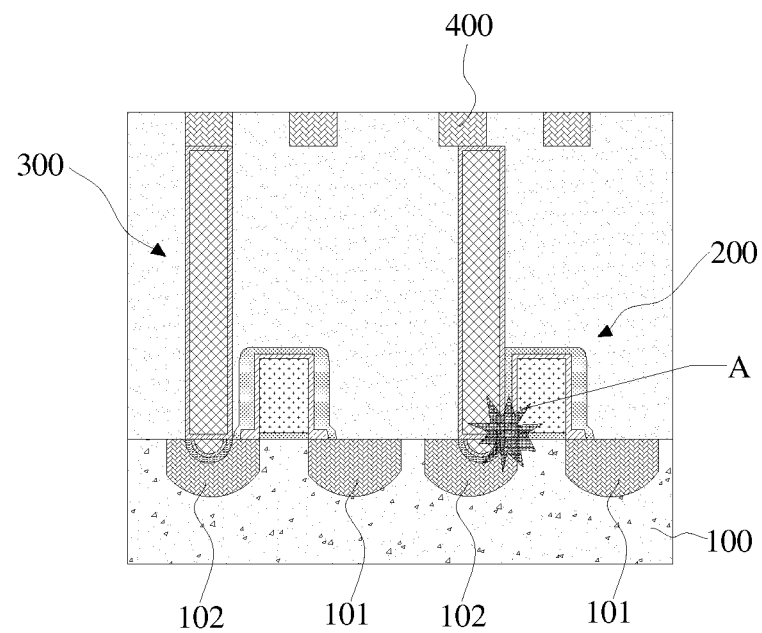
FIG. 1 illustrates a schematic structural diagram of a semiconductor device in the related art.

In the drawings: 100, substrate; 101, source region; 102, drain region; 200, gate region; 300, self-aligned contact structure; 400, metal wiring layer; 1, substrate; 11, source region; 12, drain region; 2, gate structure; 21, film layer stacking structure; 22, first gate insulating dielectric layer; 23, second gate insulating dielectric layer; 3, self-aligned contact structure; 31, first hole section; 32, second hole section; 33, third hole section; 4, interlayer insulating layer; 41, first interlayer insulating layer; 42, second interlayer insulating layer; 43, third interlayer insulating layer; 5, conductor; and 6, metal silicide layer.

DETAILED DESCRIPTION

Exemplary embodiments will now be described more fully with reference to the accompanying drawings. However, the exemplary embodiments can be implemented in various forms and should not be understood as limited to the embodiments set forth herein. Conversely, these embodiments are provided to make the disclosure more comprehensive and complete, and to fully convey the concept of the exemplary embodiments to those skilled in the art. In the drawings, the same reference numerals represent the same or similar structures, and thus the detailed description will be omitted.

Although relative terms, such as "upper" and "lower", are used in the specification to describe the relative relationship of one component to another component, these terms are used herein for convenience only, for example, according to the direction of the examples as shown in the drawings. It can be understood that if the device in the drawings is turned upside down, the components described as "upper" will become the "lower" components. When one structure is "on" the other structure, it is possible to indicate that the structure is integrally formed on the other structure, or the structure is "directly" disposed on the other structure, or the structure is "indirectly" disposed on the other structure by means of another structure.

The terms "a", "an", "the", and "said" are used to express the presence of one or more elements/parts/or the like. The terms "include" and "have" are used to be inclusive, and mean there may be additional elements/parts/or the like in addition to the listed elements/parts/or the like. The terms "first", "second" and "third" are only used as markers, not as a restriction on the number of objects.

In the related art, as shown in FIG. 1, a semiconductor device mainly includes a substrate 100, gate regions 200, self-aligned contact structures 300 and metal wiring layers 400. The substrate 100 includes source regions 101 and drain regions 102, and each gate region 200 is located above a channel region between one of the source regions 101 and one of the drain regions 102. The self-aligned contact structures 300 are formed on the substrate 100, and each self-aligned contact structure has one end in contact with the source region 101 or the drain region 102 and the other end in contact with one of the metal wiring layers 400. However, as the size of the semiconductor device decreases, the distance between each self-aligned contact structure 300 and the corresponding gate region 200 becomes shorter, and a short-circuit phenomenon easily occurs in a region A of FIG. 1. Meanwhile, to satisfy the space requirement between word lines and bit lines and the space requirement between the capacitor plugs, the self-aligned contact structures 300 are relatively narrow and the contact resistance is large.

Figure 2:
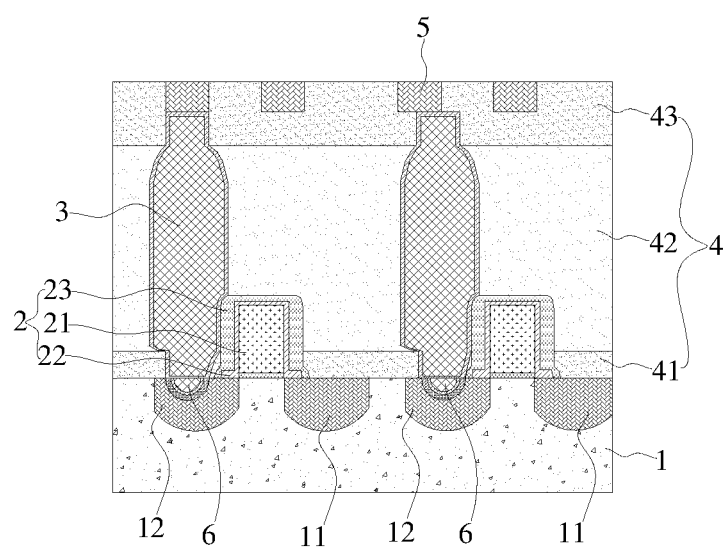
FIG. 2 illustrates a schematic structural diagram of a semiconductor device according to an embodiment of the disclosure.

An embodiment of the disclosure provides a semiconductor device, as shown in FIG. 2. The semiconductor device includes a substrate 1, a gate structure 2, and a self-aligned contact structure 3.

The substrate 1 may include source regions 11 and drain regions 12.

The gate structure 2 may be formed on the substrate 1, and may be located between one of the source regions 11 and one of the drain regions 12.

The self-aligned contact structure 3 may be formed on the substrate 1, and include a first contact structure, a second contact structure, and a third contact structure sequentially connected in a direction perpendicular to the substrate 1. The first contact structure may be in contact with the source region 11 or the drain region 12. The cross-sectional area of the second contact structure in a direction parallel to the substrate 1 may be greater than that of the first contact structure and that of the third contact structure in the direction parallel to the substrate 1.

According to the semiconductor device provided by the disclosure, on one hand, the gate structure 2 may be separated from the source region 11 or the drain region 12 by the self-aligned contact structure 3, which may reduce the risk of short circuit between the gate structure 2 and the source region 11 or the drain region 12; and on the other hand, since the cross-sectional area of the second contact structure in the direction parallel to the substrate 1 is greater than that of the first contact structure and that of the third contact structure in the direction parallel to the substrate 1, the transverse width of the self-aligned contact structure 3 may be increased, which is beneficial for reducing the contact resistance of the self-aligned contact structure 3. Meanwhile, as the size of the self-aligned contact structure 3 increases, the process difficulty in forming the self-aligned contact structure is reduced.

The specific details of the semiconductor device are described below in detail according to the embodiments of the disclosure.

The substrate 1 may have a flat plate structure, which may be a rectangular, circular, oval, polygonal or irregular shape, and the material of the substrate may be silicon or another semiconductor material. The shape and material of the substrate 1 are not specifically limited herein.

The substrate 1 may be a P-type substrate 1 or an n-type substrate 1, and may include source regions 11 and drain regions 12 arranged at intervals. In an implementation, the number of the source regions 11 may be one or more, and the number of the drain regions 12 may also by one or more. The source regions 11 and the drain regions 12 may be doped. For example, the substrate 1 may be the P-type substrate 1, and the source regions 11 and drain regions 12 may be n-type doped to form p-n junctions. For example, the source regions 11 and the drain regions 12 may be doped with an n-type doping material, so that the source regions 11 and the drain regions 12 form the n-type semiconductor. The n-type doping material may be an element in group IV of the periodic table, such as phosphorus, and may be other elements, which are not listed herein.

In an implementation, the source regions 11 and drain regions 12 may be implanted with phosphorous ions by ion implantation, and certainly, the source regions 11 and/or the drain regions 12 may also be doped by other processes, which are not specifically limited herein.

A channel region may be formed between one of the source regions 11 and one of the drain regions 12, through which the current may flow. A gate structure 2 may be formed on the substrate 1 and may be located between the source region 11 and the drain region 12, that is, the gate structure 2 may be located in the channel region between the source region 11 and the drain region 12, and the current in the channel regions may be controlled by the electrical potential of the gate structure 2 to realize a gate control function.

The gate structure 2 may be formed on the channel region of the substrate 1 through processes such as atomic layer deposition, chemical vapor deposition, physical vapor deposition, magnetron sputtering or vacuum evaporation. The gate structure 2 may include a film layer stacking structure 21 and a gate insulating dielectric layer located on the side wall and top of the film layer stacking structure 21. The film layer stacking structure 21 and the self-aligned contact structure 3 can be separated by a non-zero distance through the gate insulating dielectric layer, and the risk of short circuit is reduced.

In an implementation, the number of the gate structures 2 may be more than one, and the multiple gate structures 2 may be arranged side by side on the substrate 1. A film layer stacking structure 21 of each gate structure 2 may include a gate dielectric layer and a gate electrode layer, and the gate dielectric layer may be formed on the substrate 1, and formed on the side of the gate dielectric layer distal from the substrate 1. By arranging the gate dielectric layer, the physical size between the gate electrode layer and the drain region 12 may be increased, the electric field between the drain region 12 and the gate electrode layer may be reduced, and thus the drain current of the drain region 12 may be reduced.

Each gate dielectric layer may be formed directly above the channel region on the substrate 1, and may be a thin film formed on the surface of the substrate 1, or may be a coating formed on the surface of the substrate 1, which is not specifically limited herein.

Each gate electrode layer is located on the side of the corresponding gate dielectric layer distal from the substrate 1, and may be used to control the electric field intensity on the surfaces of the source region 11 or the drain region 12, so as to control the current between the source region 11 and the drain region 12. Each gate electrode layer may be a thin film formed on the side of the corresponding gate dielectric layer distal from the substrate 1, or may be a coating formed on the surface of the corresponding gate dielectric layer distal from the substrate 1, which is not specifically limited herein.

Each gate insulating dielectric layer may cover the side walls and the top of the corresponding film layer stacking structure 21. In some embodiments, each gate insulating dielectric layer may have a multilayer structure, and may at least include a first gate insulating dielectric layer 22 and a second gate insulating dielectric layer 23. The first gate insulating dielectric layer 22 may be attached to the side wall and top of the corresponding film layer stacking structure 21 in a conformal mode, the second gate insulating dielectric layer 23 may be attached to the surface of the first gate insulating dielectric layer 22 in a conformal mode, and both the first gate insulating dielectric layer 22 and the second gate insulating dielectric layer 23 may be made of a material with a relatively low permittivity, which is beneficial to reduce the electric field intensity of depletion layers, thereby further reducing GIDL (gate-induced drain leakage) effect.

The self-aligned contact structure 3 may be formed on the substrate 1, and has one end in contact with the source region 11 or the drain region 12. The self-aligned contact structure 3 and the gate structure 2 may be arranged side by side. For example, the self-aligned contact structure 3 may be arranged at one side of the gate structure 2 and may be in contact with the gate insulating dielectric layer of the gate structure 2, which is beneficial to reduce the device size. Meanwhile, the gate electrode layer may be separated from the self-aligned contact structure 3 by the gate insulating dielectric layer, which may reduce the risk of short circuit.

The self-aligned contact structure 3 may be columnar and may extend to the side distal from the substrate 1. The self-aligned contact structure 3 includes a first contact structure, a second contact structure and a third contact structure sequentially connected in the direction perpendicular to the substrate 1. The first contact structure may be in contact with the source region 11 or drain region 12, and the cross-sectional area of the second contact structure in the direction parallel to the substrate 1 may be greater than that of the first contact structure and that of the third contact structure in the direction parallel to the substrate 1, so as to increase the transverse width of the self-aligned contact structure 3, which is beneficial to reduce the contact resistance of the self-aligned contact structure 3. Meanwhile, as the size of the self-aligned contact structure 3 is increased, the process difficulty in forming the self-aligned contact structure can be reduced. In addition, since the contact area of the third contact structure with the source region 11 or the drain region 12 is small, the contact resistance can be further reduced.

The first contact structure, the second contact structure, and the third contact structure may be stacked layer structures formed by different processes, or may be an integrated structure formed by a single-deposition process, which is not specifically limited herein.

The self-aligned contact structures 3 may be made of a conductive material, such as tungsten or copper, or other conductive materials, which are not specifically limited herein. The material of the edges of the self-aligned contact structure 3 may be the same as or different from the material of its interior, which is not specifically limited herein.

In an implementation, the second contact structure of the self-aligned contact structure 3 may include at least a first contact section and a second contact section in contact connection with each other. The first contact section may be adjacent to the first contact structure and the second contact section may be adjacent to the third contact structure. In order to improve the device integration, at least part of the side wall of the first contact section may abut against the edge of the gate structure 2, i.e., the first contact section may abut against the surface of the second gate insulating dielectric layer 23 distal from the first gate insulating dielectric layer 22, and the cross-sectional area of the second contact section may be greater than that of the first contact section in the direction parallel to a substrate 1, so that the transverse width of the quasi-contact structure is increased, and the contact resistance is reduced.

When multiple gate structures 2 are arranged, multiple self-aligned contact structures 3 may also be arranged, and the self-aligned contact structures 3 may be arranged at intervals and may be alternately distributed with the gate structures 2.

In an embodiment of the disclosure, the semiconductor device of the disclosure may further include an interlayer insulating layer 4, and the interlayer insulating layer 4 may be formed on the substrate 1 and may cover the gate structure 2. The interlayer insulating layer 4 may be formed on the substrate 1 by a process such as atomic layer deposition, chemical vapor deposition, physical vapor deposition, magnetron sputtering, or vacuum evaporation.

The interlayer insulating layer 4 may be made of an insulating material, and the gate structures 2 may be separated by the interlayer insulating layer 4 to reduce the drain current. For example, the material of the interlayer insulating layer 4 may be silicon dioxide or silicon nitride, and of course, other insulating materials may be used, which are not listed herein.

The self-aligned contact structure 3 may be formed in the interlayer insulating layer 4. In an implementation, the interlayer insulating layer 4 may include a first interlayer insulating layer 41, a second interlayer insulating layer 42, and a third interlayer insulating layer 43 sequentially stacked. The first interlayer insulating layer 41, the second interlayer insulating layer 42, and the third interlayer insulating layer 43 may be sequentially formed on the substrate 1 by using a process such as atomic layer deposition, chemical vapor deposition, physical vapor deposition, magnetron sputtering, or vacuum evaporation. The first contact structure may be located in the first interlayer insulating layer 41, the second contact structure may be located in the second interlayer insulating layer 42, and the third contact structure may be located in the third interlayer insulating layer 43.

The material density of the second interlayer insulating layer 42 may be less than that of the first interlayer insulating layer 41 and that of the third interlayer insulating layer 43. During etching of the second interlayer insulating layer 42, the etching rate can be controlled such that the etching rate of the second interlayer insulating layer 42 is greater than that of the first interlayer insulating layer 41 and that of the third interlayer insulating layer 43, and further, the cross-sectional area of the finally formed second contact structure in the direction parallel to the substrate 1 is greater than that of the first contact structure and that of the third contact structure in the direction parallel to the substrate 1, so that the transverse width of the self-aligned contact structure 3 may be increased, which is beneficial for reducing the contact resistance of the self-aligned contact structure 3.

In an embodiment, as shown in FIG. 4, the operation of forming the self-aligned contact structures 3 on the substrate may include the following steps.

In S110, a first interlayer insulating layer, a second interlayer insulating layer and a third interlayer insulating layer are sequentially formed on the surface of the substrate. The first interlayer insulating layer is located in the region outside the gate structures, and the second interlayer insulating layer covers the gate structures.

Figure 5:
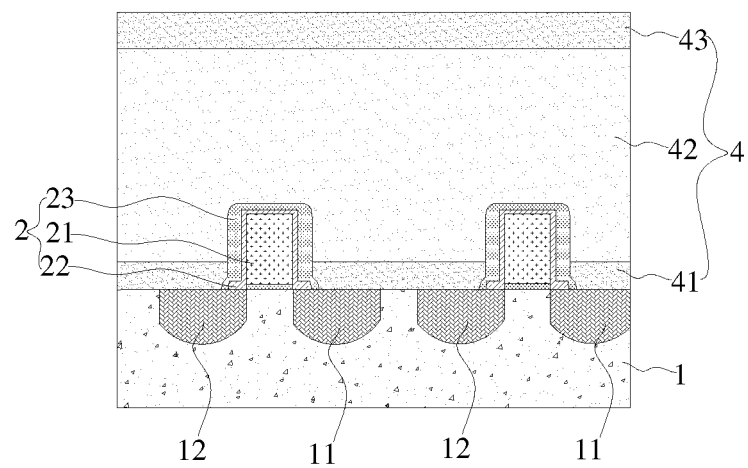
FIG. 5 illustrates a schematic structural diagram corresponding to FIG. 4 after step S110 is completed.

As shown in FIG. 5, the first interlayer insulating layer 41 may be a thin film or a coating formed on the surface of the substrate 1, which is not specifically limited herein. The first interlayer insulating layer 41 may be formed on the region outside the gate structures 2 in the substrate 1 by using a process such as atomic layer deposition, chemical vapor deposition, physical vapor deposition, magnetron sputtering, or vacuum evaporation. The surface of the first interlayer insulating layer 41 distal from the substrate 1 may be lower than the surface of the gate structure 2 distal from the substrate 1.

The second interlayer insulating layer 42 may be formed on the surface of the first interlayer insulating layer 41 distal from the substrate 1 by magnetron sputtering. The second interlayer insulating layer 42 may cover the gate structures 2, and for subsequent etching, the material density of the second interlayer insulating layer 42 may be less that of the first interlayer insulating layer 41.

The third interlayer insulating layer 43 may be formed on the side of the second interlayer insulating layer 42 distal from the first interlayer insulating layer 41 by vacuum evaporation, and the material density of the third interlayer insulating layer 43 may be greater than that of the second interlayer insulating layer 42. In the embodiment of the disclosure, the structure after step S110 is completed is shown in FIG. 5.

In S120, the first interlayer insulating layer, the second interlayer insulating layer, and the third interlayer insulating layer are etched respectively to form contact holes. Each contact hole includes a first hole section, a second hole section and a third hole section that are sequentially butted, and the cross-sectional area of the second hole section in the direction parallel to the substrate is greater than that of the first hole section and that of the third hole section in the direction parallel to the substrate.

Figure 6:
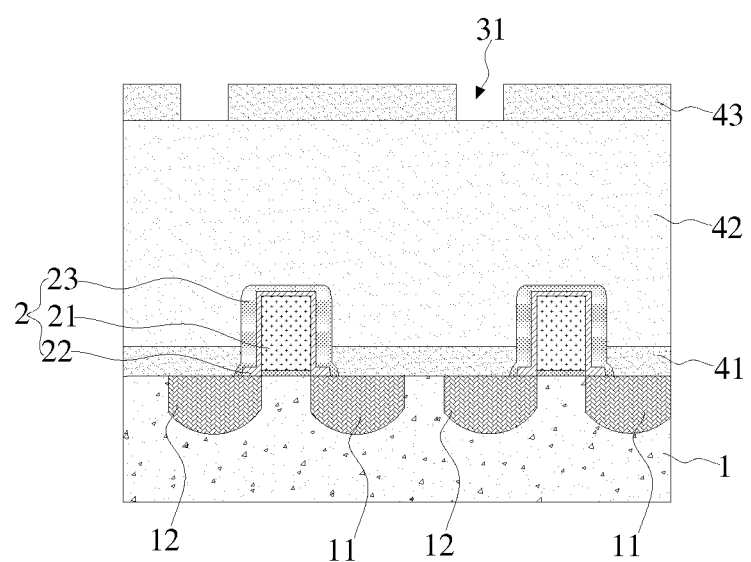
FIG. 6 illustrates a schematic diagram of a first hole section according to an embodiment of the disclosure.

The third interlayer insulating layer 43 may be etched to form the first hole sections 31 for forming third contact structures, as shown in FIG. 6. Specifically, the third interlayer insulating layer 43 may be etched by an anisotropic etching process. Each first hole section 31 may be a via, and may expose the second interlayer insulating layer 42.

Figure 7:
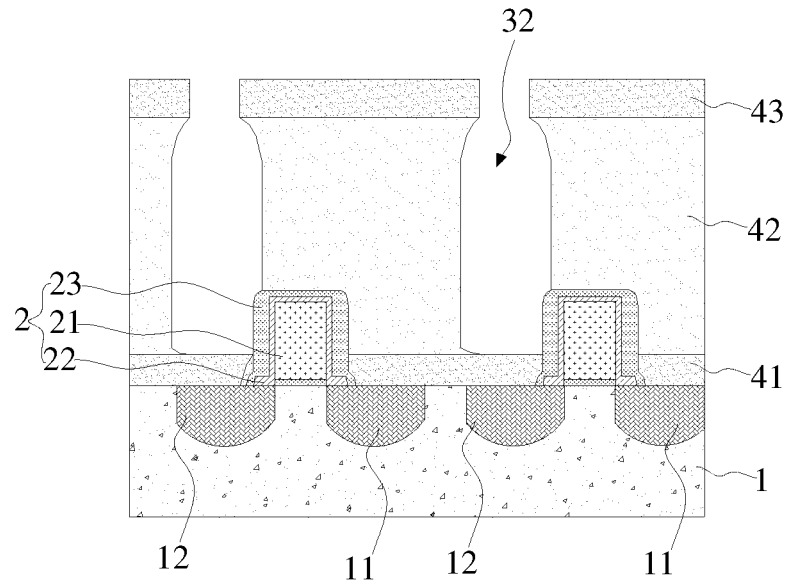
FIG. 7 illustrates a schematic diagram of a second hole section according to an embodiment of the disclosure.

The etching rate may be controlled at the first hole sections 31 and the second interlayer insulating layer 42 may be etched by a selective etching process to form the second hole sections 32 for forming the second contact structures, as shown in FIG. 7. The etching rate of the second interlayer insulating layer 42 may be greater than that of the first interlayer insulating layer 41, and each second hole section 32 formed by etching may have an aperture greater than that of the corresponding first hole section 31. Each second hole section 32 may be a via, and may expose the first interlayer insulating layer 41.

Figure 8:
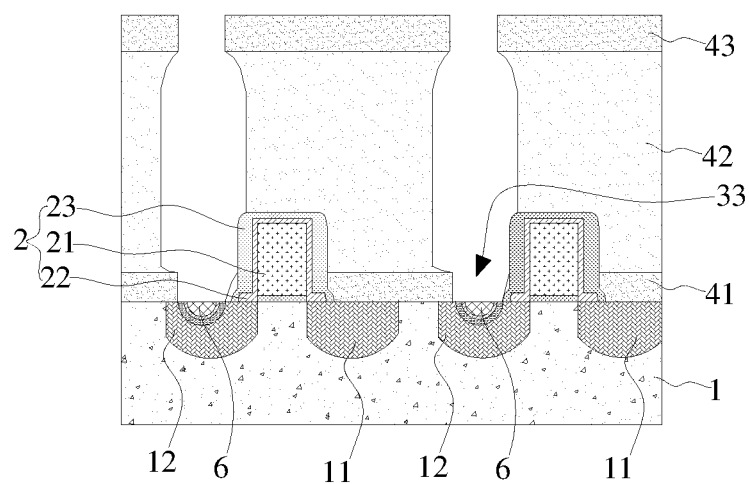
FIG. 8 illustrates a schematic diagram of a third hole section according to an embodiment of the disclosure.

The first interlayer insulating layer 41 may be anisotropically etched at the second hole sections 32 to form the third hole sections 33 for forming the first contact structures, as shown in FIG. 8. Each third hole section 33 may be a via, and a side of the third hole section 33 distal from the corresponding second hole section 32 may abut against the substrate 1.

In S130, a conductive material is deposited in the first hole sections, the second hole sections, and the third hole sections to form self-aligned contact structures.

Figure 9:
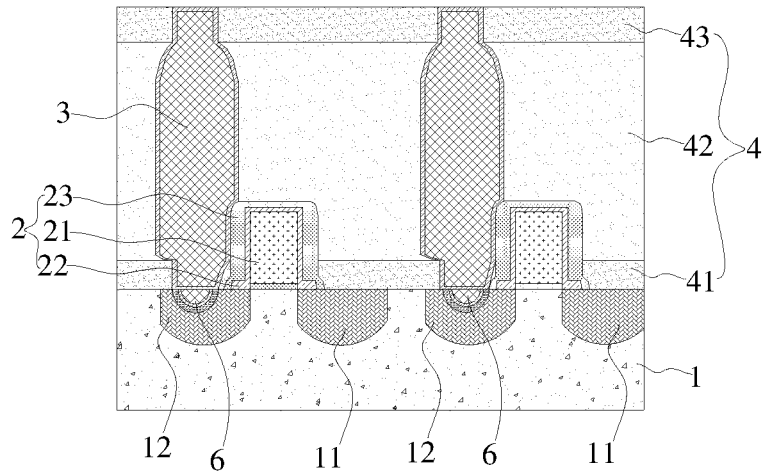
FIG. 9 illustrates a schematic structural diagram corresponding to FIG. 4 after step S130 is completed.

The conductive material may be deposited in the first hole sections 31, the second hole sections 32 and the third hole sections 33 by atomic layer deposition, respectively, to form the self-aligned contact structures 3. The surface of each self-aligned contact structure 3 distal from the substrate 1 may be flush with the surface of the third interlayer insulating layer 43 distal from the substrate 1. In the embodiment of the disclosure, a structure after step S130 is completed is shown in FIG. 9.

The semiconductor device in the embodiment of the disclosure may further include metal silicide layers 6, as shown in FIG. 8. Each metal silicide layer 6 may be formed in the substrate 1 and may be in contact with the first contact structure, so as to prevent the self-aligned contact structures 3 from contacting the source regions 11 or the drain regions 12 poorly after a subsequent annealing process, and improve the contact reliability of the self-aligned contact structures 3 with the source regions 11 or the drain regions 12.

For example, after forming the contact holes and before forming the self-aligned contact structures 3, a metal material may be implanted in the regions, in contact with the contact holes, of the substrate 1 by using an ion implantation process to form the metal silicide layers. In an implementation, the metal material may be cobalt, and the material of the metal silicide layers 6 may be cobalt silicide, and of course, other materials may also be used, which is not specifically limited herein. After the metal silicide layers 6 are formed, the conductive material may be deposited in the contact holes to form the self-aligned contact structures 3, and the self-aligned contact structures 3 may be in contact connection with the metal silicide layers 6.

It should be noted that, in the embodiments of the disclosure, the width of each first contact structure in the direction parallel to the substrate 1 may be equal to that of the corresponding third contact structure in the direction parallel to the substrate 1, the width of each third contact structure in the direction parallel to the substrate 1 may be smaller than that of the corresponding second contact structure in the direction parallel to the substrate 1, the width of each second contact structure in the direction parallel to the substrate 1 may be smaller than 1.5 times the width of the corresponding third contact structure in the direction parallel to the substrate 1, and the width of the metal silicide layer 6 may be set according to actual requirements of the device.

The semiconductor device in the embodiment of the disclosure may further include a metal wiring layer. The metal wiring layer may be arranged on the side of the interlayer insulating layer 4 distal from the substrate 1, and may include multiple conductors 5 distributed side by side. Each conductor 5 may be in a strip shape, as shown in FIG. 3. The conductors 5 may be made of a conductive or semiconductive material, for example, tungsten, copper, polysilicon, or the like. The conductors 5 may be distributed in correspondence with the respective self-aligned contact structures 3 and may be electrically connected to the respective self-aligned contact structures 3.

For example, the metal wiring layers may be formed on the side of the interlayer insulating layer 4 distal from the substrate 1 by vacuum evaporation, magnetron sputtering, or chemical vapor deposition, and the multiple conductors 5 distributed side by side may be formed in the metal wiring layers by etching, and of course, each conductor 5 may also be formed by other methods, which are not listed herein.

The semiconductor device provided by the disclosure may be a memory chip, such as a DRAM (Dynamic Random Access Memory), and of course, may be other semiconductor devices, which are not listed herein.

Figure 10:
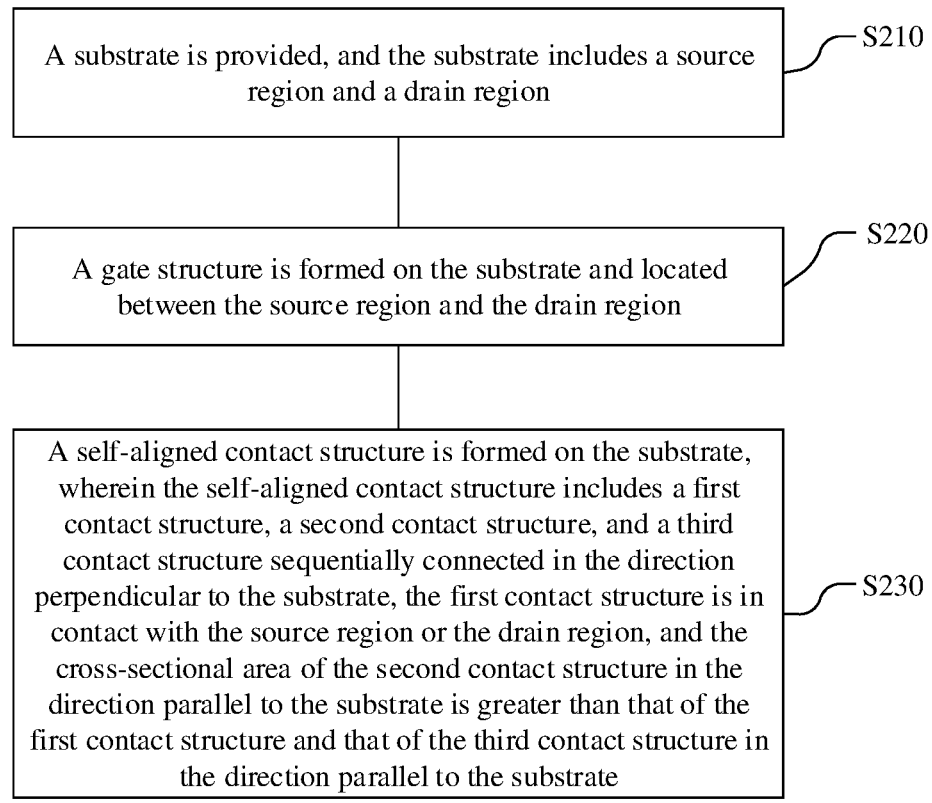
FIG. 10 illustrates a flowchart of a forming method for a semiconductor device according to an embodiment of the disclosure.

The disclosure further provides a forming method of a semiconductor device, which may include the following steps, as shown in FIG. 10.

In S210, a substrate is provided, and the substrate includes a source region and a drain region.

In S220, a gate structure is formed on the substrate and located between the source region and the drain region.

In S230, a self-aligned contact structure is formed on the substrate. The self-aligned contact structure includes a first contact structure, a second contact structure, and a third contact structure sequentially connected in the direction perpendicular to the substrate. The first contact structure is in contact with the source region or the drain region, and the cross-sectional area of the second contact structure in the direction parallel to the substrate is greater than that of the first contact structure and that of the third contact structure in the direction parallel to the substrate.

According to the forming method of the semiconductor device provided by the disclosure, on one hand, the gate structure 2 may be separated from the source region 11 or the drain region 12 by the self-aligned contact structure 3, so that the risk of short circuit between the gate structure 2 and the source region 11 or the drain region 12 may be reduced; and on the other hand, since the cross-sectional area of the second contact structure in the direction parallel to the substrate 1 is greater than that of the first contact structure and that of the third contact structure in the direction parallel to the substrate 1, the transverse width of the self-aligned contact structure 3 can be increased, which is beneficial for reducing the contact resistance of the self-aligned contact structure 3. Meanwhile, as the size of the self-aligned contact structure 3 is increased, the process difficulty in forming the self-aligned contact structures is reduced.

The specific details and the manufacturing process of each part in the forming method of the semiconductor device are already described in detail in the corresponding embodiments, and therefore, the details are not elaborated herein.

Other embodiments of the present disclosure will be apparent to those skilled in the art from consideration of the specification and practice of the invention disclosed herein. This application is intended to cover any variations, uses or adaptations of the present disclosure following the general principles thereof and including common knowledge or conventional techniques in the art that are not disclosed in the present disclosure. The specification and embodiments are regarded as exemplary only, and the true scope and spirit of the disclosure is indicated by the claims.

The invention claimed is:

1. A semiconductor device, comprising:
a substrate, comprising a source region and a drain region;
a gate structure, formed on the substrate and located between the source region and the drain region;
a self-aligned contact structure, formed on the substrate and comprising a first contact structure, a second contact structure and a third contact structure that are sequentially connected in a direction perpendicular to the substrate, wherein the first contact structure is in contact with the source region or the drain region, and a cross-sectional area of the second contact structure in a direction parallel to the substrate is greater than that of the first contact structure and that of the third contact structure in the direction parallel to the substrate; and
an interlayer insulating layer formed on the substrate and covering the gate structure, wherein the self-aligned contact structure is formed in the interlayer insulating layer, and the interlayer insulating layer comprises a first interlayer insulating layer, a second interlayer insulating layer, and a third interlayer insulating layer stacked sequentially, the first interlayer insulating layer covers part of the substrate, the first contact structure is located in the first interlayer insulating layer, the second contact structure is located in the second interlayer insulating layer, and the third contact structure is located in the third interlayer insulating layer.

2. The semiconductor device of claim 1, wherein
a material density of the second interlayer insulating layer is less than that of the first interlayer insulating layer and that of the third interlayer insulating layer.

3. The semiconductor device of claim 1, further comprising:
a metal wiring layer, arranged on a side of the interlayer insulating layer distal from the substrate, and electrically connected to the self-aligned contact structure.

4. The semiconductor device of claim 1, wherein
the self-aligned contact structure is formed in the interlayer insulating layer.

5. The semiconductor device of claim 1, further comprising:
a metal silicide layer formed in the substrate and in contact with the first contact structure.

6. The semiconductor device of claim 1, wherein
the second contact structure of the self-aligned contact structure comprises at least a first contact section adjacent to the first contact structure and a second contact section adjacent to the third contact structure, and a cross-sectional area of the second contact section is greater than that of the first contact section in the direction parallel to the substrate.

7. The semiconductor device of claim 6, wherein
at least part of a side wall of the first contact section abuts against an edge of the gate structure.

8. The semiconductor device of claim 1, wherein
the gate structure comprises a film layer stacking structure and a gate insulating dielectric layer located on a side wall and top of the film layer stacking structure, and the film layer stacking structure is separated from the self-aligned contact structure by the gate insulating dielectric layer.

9. The semiconductor device of claim 8, wherein
the film layer stacking structure comprises a gate dielectric layer formed on the substrate and a gate electrode layer formed on a side of the gate dielectric layer distal from the substrate.

10. A forming method of a semiconductor device, comprising:
   providing a substrate, wherein the substrate comprises a source region and a drain region;
   forming a gate structure on the substrate, wherein the gate structure is located between the source region and the drain region;
   forming an interlayer insulating layer on the substrate, wherein the interlayer insulating layer covers the gate structure, a self-aligned contact structure is formed in the interlayer insulating layer, and the interlayer insulating layer comprises a first interlayer insulating layer, a second interlayer insulating layer, and a third interlayer insulating layer stacked sequentially, the first interlayer insulating layer covers part of the substrate; and
   forming the self-aligned contact structure on the substrate, wherein the self-aligned contact structure comprises a first contact structure, a second contact structure and a third contact structure that are sequentially connected in a direction perpendicular to the substrate, the first contact structure is located in the first interlayer insulating layer, the second contact structure is located in the second interlayer insulating layer, and the third contact structure is located in the third interlayer insulating layer, the first contact structure is in contact with the source region or the drain region, and a cross-sectional area of the second contact structure in a direction parallel to the substrate is greater than that of the first contact structure and that of the third contact structure in the direction parallel to the substrate.

11. The forming method of claim 10, further comprising:
   forming a metal wiring layer on a side of the interlayer insulating layer distal from the substrate, wherein the metal wiring layer is electrically connected to the self-aligned contact structure.

12. The forming method of claim 10, wherein
   the second contact structure of the self-aligned contact structure comprises at least a first contact section adjacent to the first contact structure and a second contact section adjacent to the third contact structure, and a cross-sectional area of the second contact section is greater than that of the first contact section in the direction parallel to the substrate.

13. The forming method of claim 12, wherein
   at least part of a side wall of the first contact section abuts against an edge of the gate structure.

14. The forming method of claim 10, wherein
   a material density of the second interlayer insulating layer is less than that of the first interlayer insulating layer and that of the third interlayer insulating layer.

15. The forming method of claim 14, wherein
   forming the self-aligned contact structure on the substrate comprises:
   sequentially forming the first interlayer insulating layer, the second interlayer insulating layer and the third interlayer insulating layer on a surface of the substrate, wherein the first interlayer insulating layer is located in a region outside the gate structure, and the second interlayer insulating layer covers the gate structure;
   etching the first interlayer insulating layer, the second interlayer insulating layer and the third interlayer insulating layer respectively to form contact holes, wherein each contact hole comprises a first hole section, a second hole section and a third hole section connected sequentially, and a cross-sectional area of the second hole section in the direction parallel to the substrate is greater than that of the first hole section and that of the third hole section in the direction parallel to the substrate; and
   depositing a conductive material in the first hole section, the second hole section and the third hole section to form the self-aligned contact structure.

* * * * *